US012716125B2

(12) United States Patent
Penmethsa et al.

(10) Patent No.: US 12,716,125 B2
(45) **Date of Patent: *Aug. 25, 2026**

(54) MULTICATHODE PVD SYSTEM FOR HIGH ASPECT RATIO BARRIER SEED DEPOSITION

(71) Applicant: Applied Materials, Inc., Santa Clara, CA (US)

(72) Inventors: Harish Y. Penmethsa, Dublin, CA (US); Ming-Jui Li, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/971,510

(22) Filed: Dec. 6, 2024

(65) Prior Publication Data

US 2025/0101572 A1 Mar. 27, 2025

Related U.S. Application Data

(63) Continuation of application No. 18/098,993, filed on Jan. 19, 2023, now Pat. No. 12,195,843.

(51) Int. Cl.
*C23C 14/50* (2006.01)
*C23C 14/04* (2006.01)
(Continued)

(52) U.S. Cl.
CPC .......... *C23C 14/505* (2013.01); *C23C 14/044* (2013.01); *C23C 14/14* (2013.01);
(Continued)

(58) Field of Classification Search
CPC ..... C23C 14/505; C23C 14/044; C23C 14/14; C23C 14/352; H01J 37/3452; H01J 37/3488
(Continued)

(56) References Cited

U.S. PATENT DOCUMENTS 5,334,302 A 8/1994 Kubo et al.
6,679,981 B1 1/2004 Pan et al.
(Continued)

FOREIGN PATENT DOCUMENTS

JP 2001-234336 A 8/2001
TW 202235645 A 9/2022

OTHER PUBLICATIONS

International Search Report/Written Opinion Issued to PCT/US2024/011959 of May 13, 2024.
(Continued)

*Primary Examiner* — Rodney G Mcdonald
(74) *Attorney, Agent, or Firm* — Patterson + Sheridan, LLP

(57) ABSTRACT

Apparatus and methods for multi-cathode barrier seed deposition for high aspect ratio features in a physical vapor deposition (PVD) process are provided herein. In some embodiments, a PVD chamber includes a pedestal disposed within a processing region of the PVD chamber. The pedestal rotates with a workpiece on it. The PVD chamber includes a lid assembly includes a first target and a second target of a same target material, where a first surface of the first target defines a first zone of the processing region a first distance from the upper surface of the pedestal, and a second surface of the second target defines a second zone of the processing region a second distance from the plane of the upper surface of the pedestal. A system controller is configured to simultaneously control a first voltage bias for the first target and a second voltage bias for the second target.

15 Claims, 8 Drawing Sheets

(51) Int. Cl.
*C23C 14/14* (2006.01)
*C23C 14/35* (2006.01)
*H01J 37/34* (2006.01)

(52) U.S. Cl.
CPC ........ *C23C 14/352* (2013.01); *H01J 37/3452* (2013.01); *H01J 37/3488* (2013.01)

(58) Field of Classification Search
USPC ........................................ 204/298.11, 298.16
See application file for complete search history.

(56) References Cited

U.S. PATENT DOCUMENTS

| | | | | |
|---|---|---|---|---|
| 6,790,323 | B2 | 9/2004 | Fu et al. | |
| 7,618,521 | B2 | 11/2009 | Fu | |
| 7,846,310 | B2 | 12/2010 | Gillard et al. | |
| 8,460,519 | B2 | 6/2013 | Ye et al. | |
| 9,096,927 | B2 | 8/2015 | West et al. | |
| 11,948,784 | B2 | 4/2024 | Penmethsa et al. | |
| 2002/0046945 | A1 | 4/2002 | Hosokawa et al. | |
| 2004/0020760 | A1* | 2/2004 | Kouznetsov | H01J 37/3266 204/192.12 |
| 2005/0263390 | A1* | 12/2005 | Gung | H01J 37/321 204/192.15 |
| 2006/0096851 | A1 | 5/2006 | Lavitsky et al. | |
| 2007/0095650 | A1 | 5/2007 | Ye et al. | |
| 2007/0095651 | A1 | 5/2007 | Ye et al. | |
| 2007/0102286 | A1* | 5/2007 | Scheible | H01J 37/3441 204/298.01 |
| 2012/0027954 | A1 | 2/2012 | Liu et al. | |
| 2013/0146451 | A1 | 6/2013 | Child | |
| 2013/0277203 | A1* | 10/2013 | Rasheed | H01J 37/3447 204/192.1 |
| 2015/0004432 | A1 | 1/2015 | Kim et al. | |
| 2015/0075971 | A1 | 3/2015 | Furukawa et al. | |
| 2017/0114448 | A1 | 4/2017 | Mullapudi et al. | |
| 2020/0071815 | A1 | 3/2020 | Toshima et al. | |
| 2020/0335331 | A1 | 10/2020 | Xiao et al. | |
| 2021/0351024 | A1 | 11/2021 | Sun et al. | |
| 2022/0037136 | A1 | 2/2022 | Subramani et al. | |
| 2022/0310362 | A1 | 9/2022 | Wu et al. | |
| 2023/0130947 | A1 | 4/2023 | Penmethsa et al. | |

OTHER PUBLICATIONS

Taiwanese Office Action for Application No. 113101036 dated May 15, 2026.

* cited by examiner

MULTICATHODE PVD SYSTEM FOR HIGH ASPECT RATIO BARRIER SEED DEPOSITION

CROSS-REFERENCE TO RELATED APPLICATIONS

This application is a continuation of co-pending U.S. patent application Ser. No. 18/098,993, filed Jan. 19, 2023, which is herein incorporated by reference.

BACKGROUND

Field

Embodiments of the present disclosure generally relate to physical vapor deposition (PVD) film formation on workpieces in an electronic device fabrication process, and more particularly, to apparatus and methods for improving film deposition uniformity for high aspect ratio PVD.

Description of the Related Art

Electronic device fabrication processes today often involve the use of a physical vapor deposition (PVD), or sputtering, process in a dedicated PVD chamber. The source of the sputtered material may include a planar or rotary sputtering target formed from pure metals, alloys, or ceramic materials. A magnet array, which is typically disposed within an assembly that is often referred to as a magnetron, is used to generate a magnetic field in the vicinity of the target. During processing, a high voltage is applied to the target to generate a plasma and enable the sputtering process. Because the voltage source provides a negative bias to a target, the target may also be referred to as the “cathode.” The high voltage generates an electric field inside the PVD chamber that is used to enable sputtering of the target material and generate and emit electrons from the target that are used to generate and sustain a plasma near the underside of the target. The magnet array forms a magnetic field that traps electrons and thus confines a significant portion of the plasma close to the target. The trapped electrons can then collide with and ionize the gas atoms disposed within the processing region of the PVD chamber. The collision between the trapped electron(s) and gas atoms will cause the gas atoms to emit electrons that are used to sustain and further increase the plasma density within the processing region of the PVD chamber. The plasma may include argon atoms, positively charged argon ions, free electrons, and ionized and neutral metal atoms sputtered from the target. The argon ions are accelerated towards the target due to the negative bias and collide with a surface of the target causing atoms of the target material to be ejected therefrom. The ejected atoms of target material then travel towards the workpiece and chamber shielding to incorporate into the growing thin film thereon.

PVD sputtering and control of film deposition uniformity are especially challenging when processing workpieces that have high aspect ratio features. For example, high aspect ratio vias may be formed on silicon or other semiconductor substrates, or silicon, glass, or organic interposers, such as those used for heterogeneous integration. High density vias in an interposer can enable vertical communication between chip-level interconnects and package-level interconnects. Vias are generally seeded with a layer of metal (e.g., copper) via PVD sputtering, then are electro-plated to fill the vias. In order to fill the high aspect ratio vias by electro-plating, the seed layers need to be uniformly deposited across the whole via to maintain the electrical path.

PVD sputtering can provide, relative to other deposition techniques, high step coverage, good uniformity over a large area, and high throughput. However, due to line-of-sight nature of PVD processes, a seed layer deposited within high aspect ratio vias may exhibit poor step-coverage and uniformity across a workpiece. In some cases, in order to have enough coverage of the sidewalls and bottom of the vias for successful electro-plating, PVD sputtering may need to be performed for a longer time. PVD sputtering from a single source (e.g., cathode), while sometimes cost effective from a hardware perspective, can only provide a single sputtering profile, a fixed throw distance, fixed deposition angle set by the orientation of the face of the target relative to the surface of the substrate, and a single ion energy distribution at any instant in time during processing.

Accordingly, there is a need in the art for apparatus and methods for improving film deposition uniformity and feature wall coverage for high aspect ratio features in PVS sputtering systems.

SUMMARY

Embodiments described herein generally relate to physical vapor deposition (PVD) film formation on workpieces in an electronic device fabrication process. More particularly, embodiments described herein provide apparatus and methods for improving film deposition uniformity and coverage for high aspect ratio features.

In one embodiment, a PVD chamber includes a pedestal disposed within a processing region of the PVD chamber. The pedestal has an upper surface that is configured to support a workpiece thereon. The PVD chamber includes a first motor is coupled to the pedestal, the first motor configured to rotate the pedestal about a first axis that is perpendicular to at least a portion of the upper surface of the pedestal. The PVD chamber includes a lid assembly includes a first target and a second target. A first surface of the first target defines a first zone of the processing region, a center of the first surface a first distance from a plane of the upper surface of the pedestal. A second surface of the second target defines a second zone of the processing region, a center of the second surface a second distance from the plane of the upper surface of the pedestal. The PVD chamber includes a system controller that is configured to simultaneously control a first voltage bias for the first target and a second voltage bias for the second target.

In one embodiment, a PVD chamber includes a pedestal disposed within a processing region of the PVD chamber. The pedestal has an upper surface that is configured to support a workpiece thereon. The PVD chamber includes a first motor is coupled to the pedestal, the first motor configured to rotate the pedestal about a first axis that is perpendicular to at least a portion of the upper surface of the pedestal. The PVD chamber includes a lid assembly includes a first target and a second target. A first surface of the first target defines a first zone of the processing region, a center of the first surface a first distance from a plane of the upper surface of the pedestal. A second surface of the second target defines a second zone of the processing region, a center of the second surface a second distance from the plane of the upper surface of the pedestal. The PVD chamber includes a computer readable medium storing instructions. The instructions, when executed by a processor of a system that includes the PVD chamber, cause the system to simultaneously control a first voltage bias for the first target and a second voltage bias for the second target.

Embodiments of the disclosure may further include a method for perform PVD. The method includes rotating a workpiece disposed on an upper surface of a pedestal that is configured to support the workpiece thereon, the pedestal disposed within a processing region of the PVD chamber. The method also includes sputtering material from a first target onto the workpiece during rotation in a first zone of the processing region and material from a second target onto the workpiece during the rotation in a second zone of the processing region. The method also includes simultaneously controlling a first voltage bias for the first target during sputtering the material from the first target and a second voltage bias for the second target during sputtering the material from the second target. The center of a first surface of the first target is a first distance from a plane of the upper surface, and a center of a second surface of the second target is a second distance from a plane of the upper surface.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
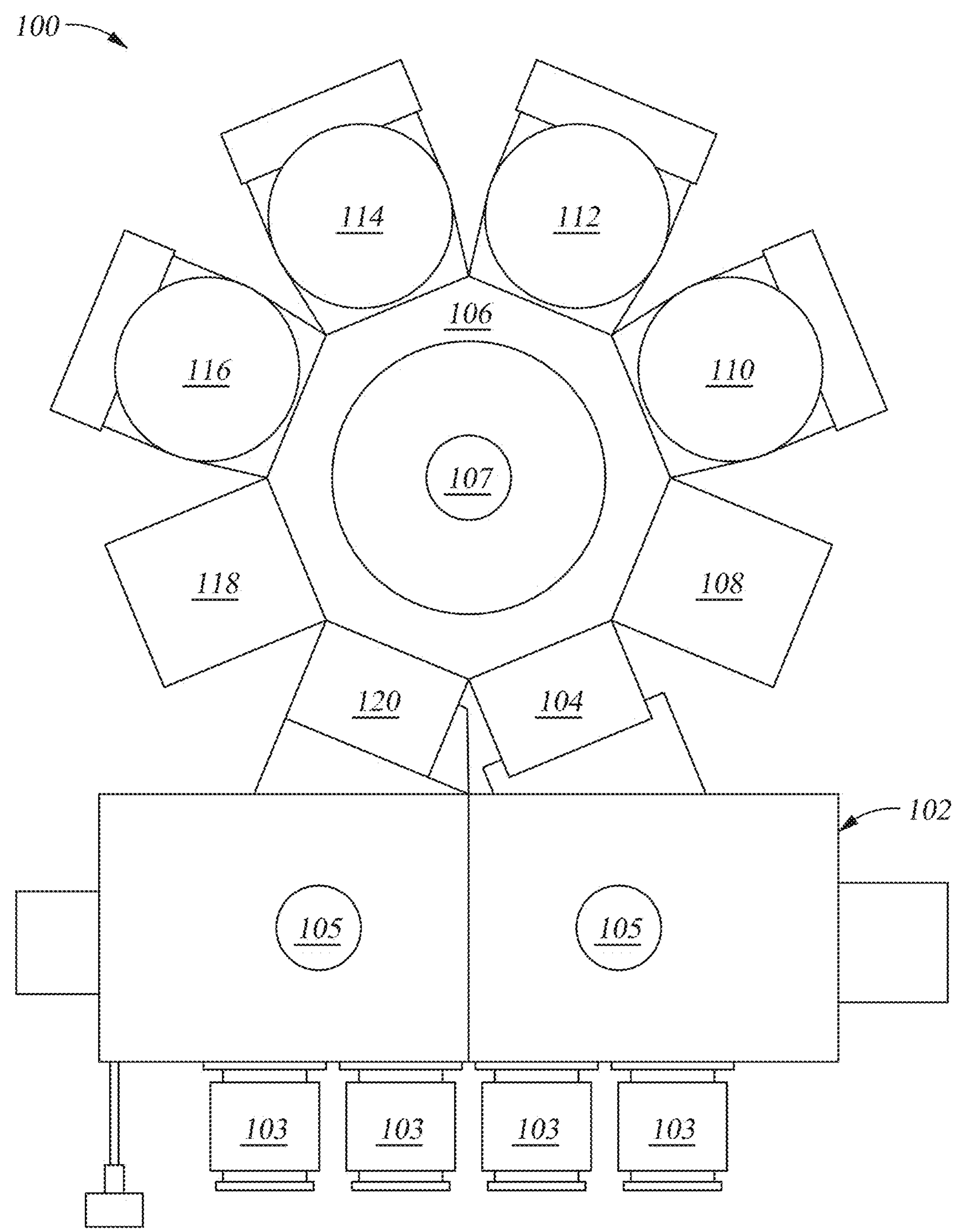
FIG. 1 is a schematic top view of an exemplary workpiece processing system, according to certain embodiments.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments of the disclosure provided herein generally relate to physical vapor deposition (PVD) of thin films on workpieces in an electronic device fabrication process. More particularly, embodiments described herein provide apparatus and methods for improving film deposition uniformity for high aspect ratio features of or in a workpiece, such as a substrate or interposer, which are commonly used in the packaging of integrated circuit containing devices. In some embodiments, the apparatus may include two or more targets that are configured to deposit the same material but are differently configured to achieve different sputtering profiles to provide different deposited film characteristics. In some embodiments, the apparatus may include two or more targets that are configured to deposit different materials. In one example, a first target may be oriented and positioned a first distance away from the workpiece and have a first bias applied during processing, resulting in a first distribution of sputtered material provided from the first target, and a second target may be oriented and positioned a second distance away from the workpiece and have a second bias applied during processing, resulting in a second distribution of sputtered material provided from the second target. The first distribution of sputtered material may be controlled to be relatively narrower in profile (e.g., over cosine distribution), higher in ionization energy, or both, and provide for relatively greater step coverage while the second distribution of sputtered material may be controlled to be relatively broader in profile (e.g., under cosine distribution), lower in ionization energy, or both, and provide for relatively more uniform coverage across the workpiece. Moreover, the use of two or more cathodes (e.g., multiple sputtering sources or targets) using the same target material provides increased process flexibility. A greater number of parameters may be adjusted and balanced, for example to balance the uniformity of coverage, step coverage, deposition throughput, or other characteristics of the deposited layers. Such parameters may include the voltage bias to the target (direct current (DC) bias, pulsed DC bias, or radio frequency (RF) bias), magnetron scanning profiles, magnetic confinement adapter levels and shaping, distance between target and workpiece to affect a throw distance, and relative angles between the targets and workpiece.

Exemplary Workpiece Processing System

FIG. 1 is a schematic top view of an exemplary workpiece processing system 100 (also referred to as a "processing platform"), according to certain embodiments. In certain embodiments, the workpiece processing system 100 is particularly configured for processing workpieces that include high aspect ratio features, such as high aspect ratio vias as described herein. In one or more embodiments, the workpiece is a substrate, such as a silicon or other semiconductor substrate, or an interposer such as an organic material containing interposer or glass interposer. The processing system 100 generally includes an equipment front-end module (EFEM) 102 for loading workpieces into the processing system 100, a first load lock chamber 104 coupled to the EFEM 102, a transfer chamber 106 coupled to the first load lock chamber 104, and a plurality of other chambers coupled to the transfer chamber 106 as described in detail below. The EFEM 102 generally includes one or more robots 105 that are configured to transfer workpieces from the FOUPs 103 to at least one of the first load lock chamber 104 or the second load lock chamber 120. Proceeding counterclockwise around the transfer chamber 106 from the first load lock chamber 104, the processing system 100 includes a first dedicated degas chamber 108, a first pre-clean chamber 110, a first deposition chamber 112, a second pre-clean chamber 114, a second deposition chamber 116, a second dedicated degas chamber 118, and a second load lock chamber 120. In certain embodiments, the transfer chamber 106 and each chamber coupled to the transfer chamber 106 are maintained at a vacuum state. As used herein, the term "vacuum" may refer to pressures less than 760 Torr, and will typically be maintained at pressures near $10^{-5}$ Torr (i.e., $\sim 10^{-3}$ Pa). However, some high-vacuum systems may operate below near $10^{-7}$ Torr (i.e., $\sim 10^{-5}$ Pa). In certain embodiments, the vacuum is created using a rough pump and/or a turbomolecular pump coupled to the transfer chamber 106 and to each of the one or more process chambers (e.g., process chambers 108-118). However, other types of vacuum pumps are also contemplated.

In certain embodiments, workpieces are loaded into the processing system 100 through a door (also referred to as an "access port"), in the first load lock chamber 104 and unloaded from the processing system 100 through a door in the second load lock chamber 120. In certain embodiments, a stack of workpieces is supported in a cassette disposed in the FOUP, and are transferred therefrom by a robot 105 to the first load lock chamber 104. Once vacuum is pulled in the first load lock chamber 104, one workpiece at a time is retrieved from the first load lock chamber 104 using a robot 107 located in the transfer chamber 106. In certain embodiments, a cassette is disposed within the first load lock chamber 104 and/or the second load lock chamber 120 to allow multiple workpieces to be stacked and retained therein before being received by the robot 107 in the transfer chamber 106 or robot 105 in the EFEM 102. However, other loading and unloading configurations are also contemplated.

Pre-cleaning of the workpieces is important to remove impurities, such as oxides, from the workpiece surface, so that films (e.g., metal films) deposited in the deposition chambers are not electrically insulated from the electrically-conductive metal surface area of the workpiece by the layer of impurities. By performing pre-cleaning in the first pre-clean chamber 110 and second pre-clean chamber 114, which share the vacuum environment similar to the first deposition chambers 112 and second deposition chamber 116, the workpieces can be transferred from the cleaning chambers to the deposition chambers without being exposed to atmosphere. This prevents formation of impurities on the workpieces during the transfer. In addition, vacuum pump-down cycles are reduced since a vacuum is maintained in the processing system 100 during transfer of the cleaned workpieces to the deposition chambers. In some embodiments, when a cassette is empty or full in the first load lock chamber 104 or the second load lock chamber 120 the processing system 100 may cause either of the load lock chambers to break vacuum so that one or more workpiece can be added or removed therefrom.

In certain embodiments, only one workpiece is processed within each pre-clean and deposition chamber at a time. Alternatively, multiple workpieces may be processed at one time, such as four to six workpieces. In such embodiments, the workpieces may be disposed on a rotatable pallet within the respective chambers. In certain embodiments, the first pre-clean chamber 110 and second pre-clean chamber 114 are inductively coupled plasma (ICP) chambers for etching the workpiece surface. However, other types of pre-clean chambers are also contemplated. In certain embodiments, one or both of the pre-clean chambers are replaced with a film deposition chamber that is configured to perform a PVD, chemical vapor deposition (CVD), or atomic layer deposition (ALD) process, such as deposition of silicon nitride.

In a pre-clean chamber that includes an ICP source, a coil at the top of the chamber is energized with an external RF source to create an excitation field in the chamber. A pre-clean gas (e.g., argon, helium) flows through the chamber from an external gas source. The pre-clean gas atoms in the chamber are ionized (charged) by the delivered RF energy. In some embodiments, the workpiece is biased by a RF biasing source. The charged atoms are attracted to the workpiece resulting in the bombardment and/or etching of the workpiece surface. Other gases besides argon may be used depending on the desired etch rate and the materials to be etched.

In certain embodiments, the first deposition chambers 112 and second deposition chamber 116 are PVD chambers. In such embodiments, the PVD chambers may be configured to deposit copper, titanium, aluminum, gold, and/or tantalum. However, other types of deposition processes and materials are also contemplated.

Exemplary PVD Chamber and Method of Use

Figure 2A:
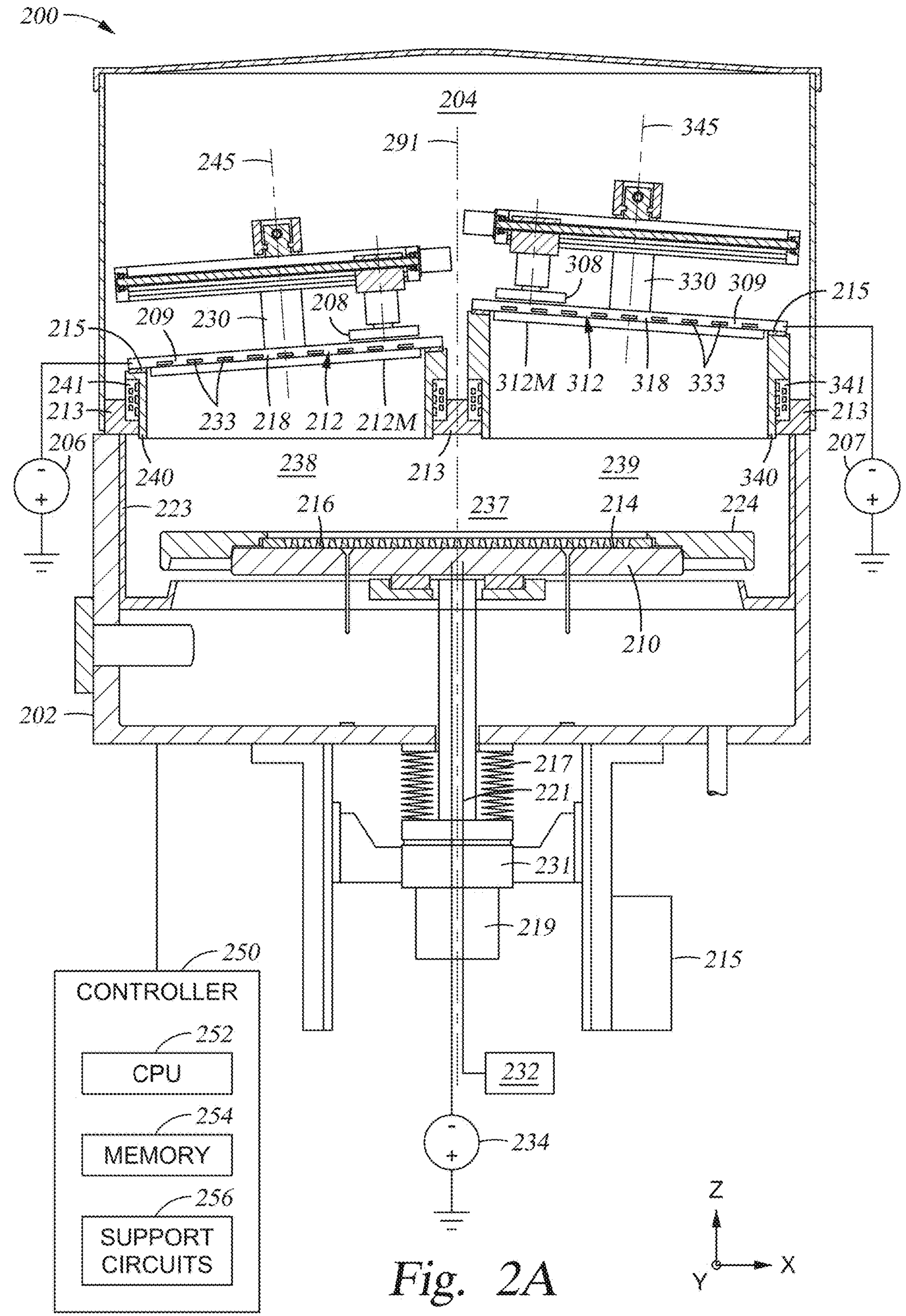
FIG. 2A is a side cross-sectional view of a PVD chamber that may be used in the workpiece processing system of FIG. 1, according to certain embodiments.

FIG. 2A is a side cross-sectional view of a PVD chamber 200 that may be used in the processing system 100 of FIG. 1, according to certain embodiments. The PVD chamber 200 enables co-sputtering from two or more different targets at the same time. The PVD chamber 200 may utilize two or more different targets that are formed of the same material for co-sputtering, for example of high aspect ratio features.

Figure 2B:
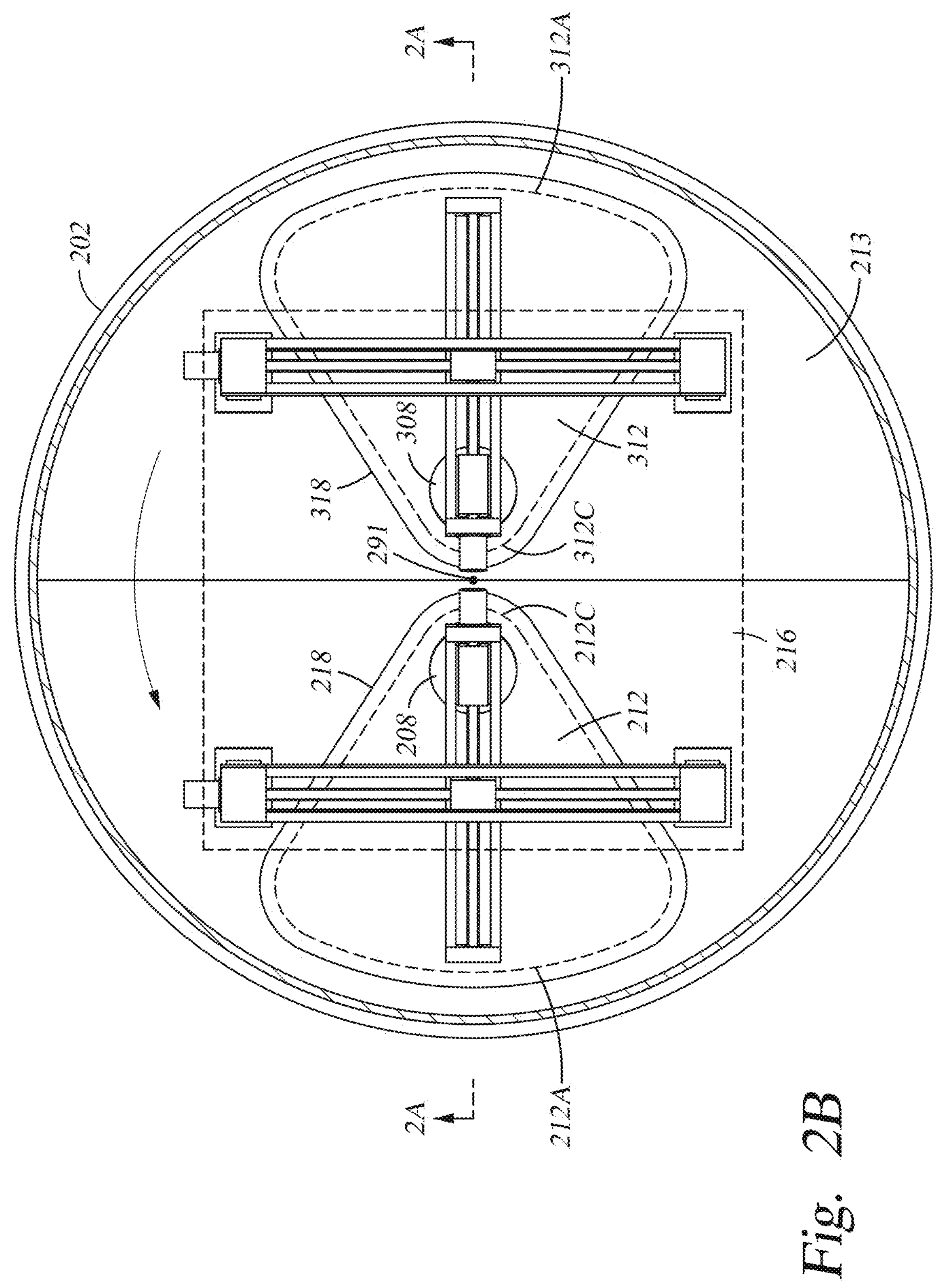
FIG. 2B is an enlarged cross-sectional view of a portion of the PVD chamber of FIG. 2A, according to certain embodiments.
Figure 2C:
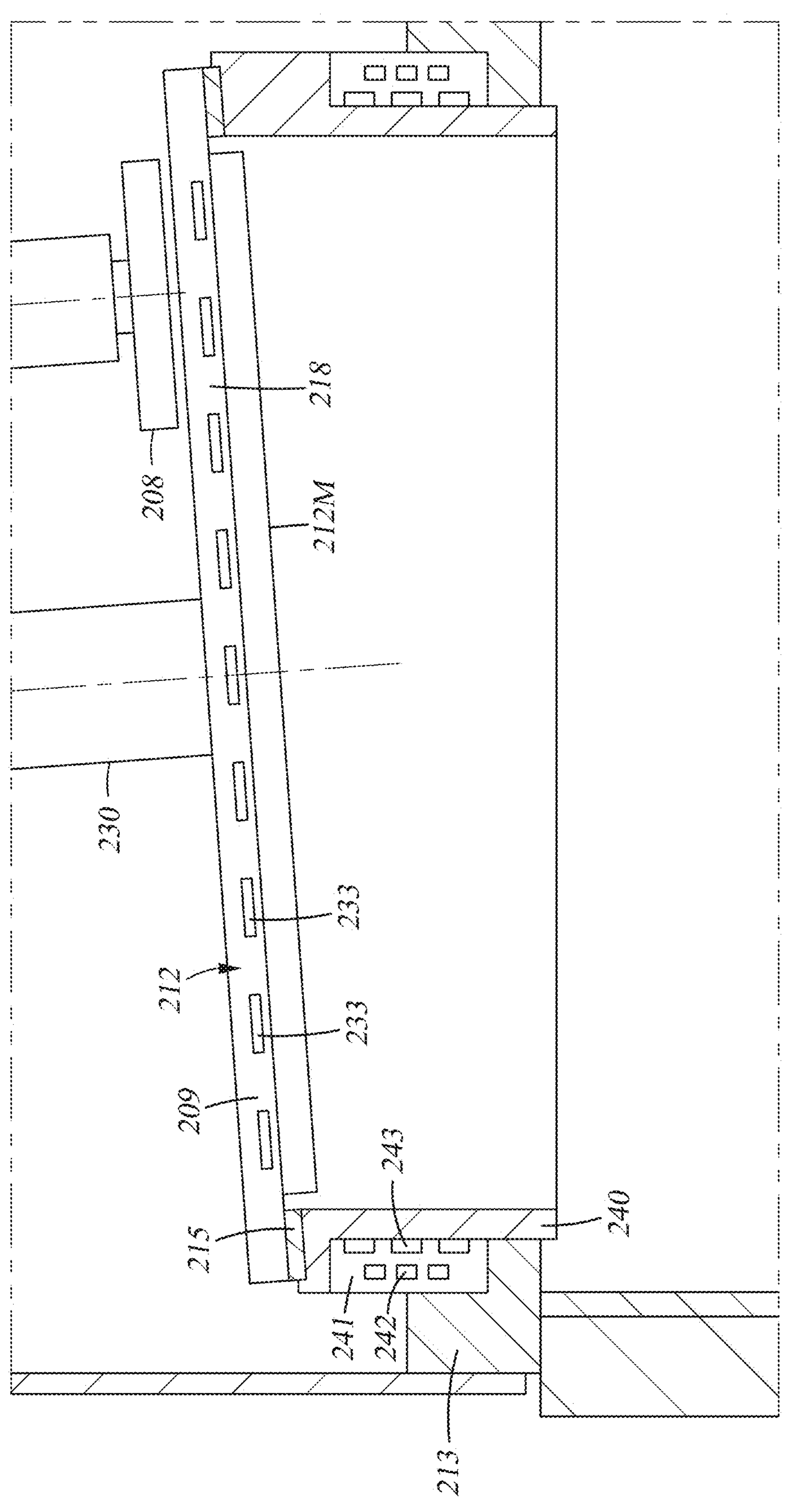
FIG. 2C is an enlarged view of a portion of the PVD chamber of FIG. 2A, according to certain embodiments.
Figure 2D:
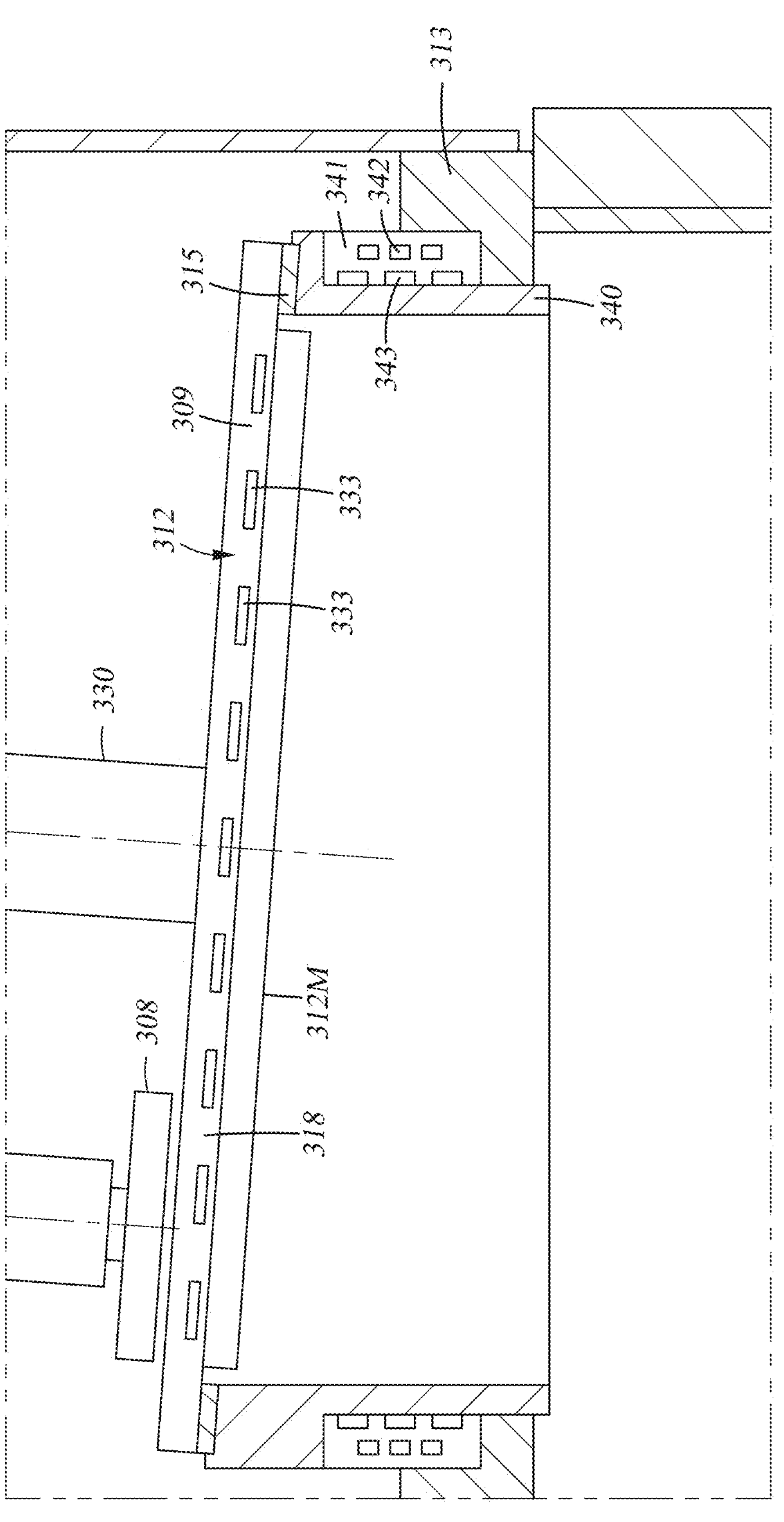
FIG. 2D is an enlarged view of a portion of the PVD chamber of FIG. 2A, according to certain embodiments.

FIG. 2A was formed by the application of the sectioning line applied to the top view of the PVD chamber 200 shown in FIG. 2B. For example, the PVD chamber 200 may represent either one of the first deposition chamber 112 or second deposition chamber 116 shown in FIG. 1. Alternatively, the PVD chamber 200 may represent an additional deposition chamber, not shown. FIG. 2B is an enlarged top cross-sectional view of an upper portion of the PVD chamber 200 of FIG. 2A, according to certain embodiments. FIGS. 2C and 2D are enlarged views of portions of the PVD chamber of FIG. 2A, according to certain embodiments. FIGS. 2A-2D are, therefore, described together herein for clarity.

The PVD chamber 200 generally includes a chamber body 202, a lid assembly 204 coupled to the chamber body 202, an optional magnetic confinement adapter 240 coupled to the lid assembly 204, a magnetron 208 coupled to the lid assembly 204, an optional magnetic confinement adapter 340 coupled to the lid assembly 204, a magnetron 308 coupled to the lid assembly 204, a pedestal 210 disposed within the chamber body 202, a target 212 disposed between the magnetron 208 and the pedestal 210, and a target 312 disposed between the magnetron 308 and the pedestal 210. During processing, the interior of the PVD chamber 200, or processing region 237, is maintained at a vacuum pressure. The processing region 237 is generally defined by the chamber body 202 and the lid assembly 204, such that the processing region 237 is primarily disposed between the target 212, the target 312, and the workpiece supporting surface 214 of the pedestal 210. A first zone 238 of the processing region 237 is generally defined by the zone of the processing region 237 that is primarily disposed between the target 212 and the workpiece supporting surface 214 of the pedestal 210. A second zone 239 of the processing region 237 is generally defined by the zone of the processing region 237 that is primarily disposed between the target 312 and the workpiece supporting surface 214 of the pedestal 210.

A power source 206 is electrically connected to the target 212 to apply a negatively biased voltage to the target 212 (e.g., a first voltage bias). A power source 207 is electrically connected to the target 312 to apply a negatively biased voltage to the target 312 (e.g., a second voltage bias). In certain embodiments, the power source 206 is either a straight DC mode source or a pulsed DC mode source, and the power source 207 is either a straight DC mode source or a pulsed DC mode source. However, other types of power sources are also contemplated, such as radio frequency (RF) sources. Power source 206 and power source 207 may be independently or jointly controlled, such as by system controller 250.

The target 212 includes a target material 212M and a backing plate 218, and is part of the lid assembly 204. A front surface of the target material 212M of the target 212 defines a portion of the processing region 237, and in particular at least a portion of the first zone 238. The backing plate 218 is disposed between the magnetron 208 and target material 212M of the target 212, wherein, in some embodiments, the target material 212M is bonded to the backing plate 218. Typically, the backing plate 218 is an integral part of the target 212 and thus for simplicity of discussion the pair may be referred to collectively as the "target." The backing plate 218 is electrically insulated from the support plate 213 of the lid assembly 204 by use of a support, which may include a support plate 213, an electrical insulator 215, and a shield 223. The electrical insulator 215 prevents an electrical short being created between the backing plate 218 and the support plate 213 of the grounded lid assembly 204. A shield 223 is coupled to the support plate 213. The shield 223 prevents material sputtered from the target 212 from depositing a film on the support plate 213. In some embodiments, the shield 223 may include a Faraday shield that is configured to allow magnetic fields generated by the target spacing adapters 240 and 340 to be provided to the first zone 238 and second zone 239, respectively.

Similarly to target 212, the target 312 includes a target material 312M and a backing plate 318, and is part of the lid assembly 204. A front surface of the target material 312M of the target 312 defines a portion of the processing region 237, and in particular the second zone 239.

As shown in FIG. 2A, the backing plate 218 has a plurality of cooling channels 233 configured to receive a coolant (e.g., DI water) therethrough to cool or control the temperature of the target 212. In certain embodiments, the backing plate 218 may have one or more cooling channels. In some examples, the plurality of cooling channels 233 may be interconnected and/or form a serpentine path through the body of the backing plate 218. Similarly, backing plate 318 may have a plurality of of cooling channels, or one or more cooling channels.

In some embodiments, the magnetron 208 and target 212, which includes the target material 212M and backing plate 218, each have a triangular or delta shape, such that a lateral edge of the target 212 includes three corners (e.g., three rounded corners shown in FIG. 2B-2C). As illustrated in FIG. 2B, the target 212 is oriented such that a tip of a corner of the triangular or delta shaped target is at or adjacent to the center axis 291. When viewed in a planar orientation view, as shown in FIG. 2B, the surface area of the target 212 is less than the surface area of the workpiece 216. In some embodiments, a surface area of the upper surface of the pedestal is greater than a surface area of the front surface of the target 212. In some embodiments, the ratio of the surface areas of the front surface of the target 212 to the deposition surface of the workpiece 216 (e.g., upper surface of the workpiece) is between about 0.1 and about 0.4.

Likewise, the magnetron 308 and target 312 may also each have a triangular or delta shape. In one or more embodiments, the magnetron 208 may have the same dimensions, shape, or both as the magnetron 308, and the target 212 may have the same dimensions, shape, or both as the target 312. In one or more embodiment, the magnetron 208 and the magnetron 308 may have different dimensions, different shape, or both. The target 212 may have different dimensions, different shape, or both, from the target 312.

As shown in FIG. 2A, the magnetron 208 and the magnetron 308 is disposed over a portion of the target 212 and the target 312, respectively, and in a region of the lid assembly 204 that is maintained at atmospheric pressure. The magnetron 208 includes a magnet plate 209 (or yoke) and a plurality of permanent magnets (not shown) attached to the shunt plate. Likewise, the magnetron 308 includes a magnet plate 309 (or yoke) and a plurality of permanent magnets (not shown) attached to the shunt plate. The magnet plate 209 and magnet plate 309 have triangular or delta shapes with three corners. The magnets of the magnet plate 209 and magnet plate 309 are permanent magnets arranged in one or more closed loops. Each of the one or more closed loops will include magnets that are positioned and oriented relative to their pole (i.e., north (N) and south(S) poles) so that a magnetic field spans from one loop to the next or between different portions of a loop. The sizes, shapes, magnetic field strength and distribution of the individual magnets are generally selected to create a desirable erosion pattern across the surface of the target 212 and target 312 when used in combination with oscillation of the magnetron 208 and the magnetron 308. In certain embodiments, the magnetron 208, magnetron 308, or both, may include a plurality of electromagnets in place of the permanent magnets.

The pedestal 210 has an upper surface 214 supporting a workpiece 216. A clamp 224 is used to hold the workpiece 216 on the upper surface 214. In certain embodiments, the clamp 224 operates mechanically. For example, the weight of the clamp 224 may hold the workpiece 216 in place. In certain embodiments, the clamp 224 is lifted by pins that are movable relative to the pedestal 210 to contact an underside of the clamp 224.

In this example, the backside of the workpiece 216 is in contact with the upper surface 214 of the pedestal 210. In some examples, the entire backside of the workpiece 216 may be in electrical and thermal contact with the upper surface 214 of the pedestal 210. The temperature of the workpiece 216 may be controlled using a temperature control system 232. In certain embodiments, the temperature control system 232 has an external cooling source that supplies coolant to the pedestal 210. In some embodiments, the external cooling source is configured to deliver a cryogenically cooled fluid (e.g., Galden®) to heat exchanging elements (e.g., coolant flow paths) within a workpiece supporting portion of the pedestal 210 that is adjacent to the upper surface 214, in order to control the temperature of the workpiece to a temperature that is less than 20° C., such as less than 0° C., such as about −20° C. or less. In certain embodiments, the temperature control system 232 includes a heat exchanger and/or backside gas flow within the pedestal 210. In some examples, the cooling source may be replaced or augmented with a heating source to increase the workpiece temperature independent of the heat generated during the sputtering process. Controlling the temperature of the workpiece 216 is important during the sputtering process to obtain a predictable and reliable thin film. In certain embodiments, a RF bias source 234 is electrically coupled to the pedestal 210 to bias the workpiece 216 during the sputtering process. Alternatively, the pedestal 210 may be grounded, floated, or biased with only a DC voltage source. Biasing the workpiece 216 can improve film density, adhesion, and material reactivity on the workpiece surface.

A pedestal shaft 221 is coupled to an underside of the pedestal 210. A rotary union 219 is coupled to a lower end of the pedestal shaft 221 to provide rotary fluid coupling with the temperature control system 232 and rotary electrical coupling with the RF bias source 234. In certain embodiments, a copper tube is disposed through the pedestal shaft 221 to couple both fluids and electricity to the pedestal 210. The rotary union 219 includes a magnetic liquid rotary sealing mechanism (also referred to as a "Ferrofluidic® seal") for vacuum rotary feedthrough.

In one example, the workpiece 216 is a square or rectangular panel. In certain embodiments, the upper surface 214 of the pedestal 210 fits a single square or rectangular panel workpiece having sides of about 500 mm or greater, such as 510 mm by 515 mm or 600 mm by 600 mm. However, apparatus and methods of the present disclosure may be implemented with many different types and sizes of workpieces.

In certain embodiments, the pedestal 210 is rotatable about a center axis 291 perpendicular to at least a portion of the upper surface 214 of the pedestal 210. In this example, the pedestal 210 is rotatable about a vertical axis, which corresponds to the z-axis. In certain embodiments, rotation of the pedestal 210 is continuous without indexing. In other words, a motor 231 driving rotation of the pedestal 210 does not have programmed stops for rotating the workpiece 216 to certain fixed rotational positions. Instead, the pedestal 210 is rotated continuously in relation to the target 212 to improve film deposition uniformity. In certain embodiments, the motor 231 is an electric servo motor. The motor 231 may be raised and lowered by a separate motor 215. The motor 215 may be an electrically powered linear actuator. A bellows 217 surrounds the pedestal shaft and forms a seal between the chamber body 202 and the motor 231 during raising and lowering of the pedestal 210.

An underside surface of the target 212, which is defined by a surface of a target material 212M, faces towards the upper surface 214 of the pedestal 210 and towards a front side of the workpiece 216. An underside surface of the target 312, which is defined by a surface of a target material 312M, also faces towards the upper surface 214 of the pedestal 210 and towards a front side of the workpiece 216. The underside surface of the target 212 faces away from the backing plate 218, which faces towards the atmospheric region or external region of the PVD chamber. Similarly, the underside surface of the target 312 faces away from the backing plate 318, which faces towards the atmospheric region or external region of the PVD chamber. In certain embodiments, the target materials 212M of the target 212 and target materials 312M of the target 312 are formed from a metal for sputtering a corresponding film composition on the workpiece 216. In one example, the target materials 212M and target materials 312M may include a pure material or alloy containing elements selected from the group of copper (Cu), molybdenum (Mo), nickel (Ni), titanium (Ti), tantalum (Ta), aluminum (Al), cobalt (Co), gold (Au), silver (Ag), manganese (Mn), and silicon (Si). The materials deposited on a workpiece 216 by the methods described herein may include pure metals, doped metals, metal alloys, metal nitrides, metal oxides, metal carbides containing these elements, as well as silicon containing oxides, nitrides or carbides.

In the illustrated embodiments, a plane that is parallel to the underside of the target 212 is tilted in relation to an upper surface of the support plate 213 by a first angle as shown in FIG. 2A. In other words, the plane of the target 212 is tilted in relation to a plane of the upper surface 214 of the pedestal 210 and, thus, in relation to the front side of the workpiece 216. Because respective bodies of each of the pedestal 210 and the target 212 are generally planar, the target 212 may also be referred to as being tilted relative to the pedestal 210, and vice versa. In certain embodiments, the angle is about 2° to about 10°, such as about 3° to about 5°. As shown in FIG. 2A, the angle is about 4°. As shown in FIG. 2A, the target 212 is tilted downward in a direction from an inner radial edge 212C of the target 212 to an outer radial edge 212A of the target 212. The inner radial edge 212C is farther from the upper surface 214 of the pedestal 210 (e.g., vertically) compared to the outer radial edge 212A. In one example, a target 212 includes an edge that includes three corners, and one of the three corners, which is coincident with the inner radial edge 212C, is positioned farther from the upper surface of the pedestal 210 as compared to each of the two other corners due to the formed tilt angle. It is believed that tilt angles above the range provided herein may have target-to-workpiece spacing that varies too much from the inner radial edge 212C to the outer radial edge 212A, which can result in undesirable variation in film deposition uniformity and/or quality. In one example, an undesirable variation in film quality will include an undesirable variation in film roughness or grain size, or workpiece center-to-edge uniformity. In another example, the undesirable variation in film quality can include an undesirable ratio of the amount of sputtered material provided to the surface of the workpiece versus the amount of sputtered material provided to the shields that surround the workpiece during a PVD process. Tilt angles below the range provided herein cause undesirable non-uniformity of the film. Therefore, the tilt angle window provided herein is able to achieve film deposition results that are improved over other conventional designs. The above description for target 212 may be applied to the target 312 relative to a plane of the upper surface 214 of the pedestal 210 and, thus, in relation to the front side of the workpiece 216.

In this example, the pedestal 210 is substantially horizontal, or parallel to the x-y plane, whereas the target 212 and the target 312 is non-horizontal, or tilted in relation to the x-y plane. However, other non-horizontal orientations of the pedestal 210 are also contemplated.

In the illustrated embodiments, the target spacing adapter 240 is coupled to the lid assembly 204. The target spacing adapter 240 is generally cylindrically shaped, enclosing a volume that is disposed below the target 212 and magnetron 208 and above the upper surface 214 of pedestal 210, including at least a portion of the first zone 238 of the processing region 237. The target spacing adapter 340 is also coupled to the lid assembly 204. The target spacing adapter 340 is also generally cylindrically shaped, enclosing a volume that is disposed below the target 312 and magnetron 308 and above the upper surface 214 of pedestal 210, including at least a portion of the second zone 239 of the processing region 237. The target spacing adapter 240 and target spacing adapter 340 each have a plurality of cooling channels 242 and cooling channels 342 configured to receive a coolant (e.g., DI water) therethrough to cool or control the temperature of the target spacing adapter 240 and the target spacing adapter 340. In some examples, the plurality of cooling channels 242 may be interconnected and/or form a serpentine path through the target spacing adapter 240. Similarly, the plurality of cooling channels 342 may be interconnected and/or form a serpentine path through the target spacing adapter 340.

In some embodiments, the target spacing adapter 240 and/or target spacing adapter 340 each include a magnetic confinement adapter, such as a magnetic confinement assembly 241 and magnetic confinement assembly 341, respectively, as illustrated in FIGS. 2C and 2D, respectively. The magnetic confinement assembly 241 is generally disposed between the target 212 and the pedestal 210, and is configured about a first center axis 245 of the first zone 238. The first center axis 245 passes through the target 212 and the upper surface 214 of pedestal 210. The magnetic confinement assembly 341 is generally disposed between the target 312 and the pedestal 210, and is configured about a second center axis 345 of the second zone 239. The second center axis 345 passes through the target 312 and the upper surface 214 of pedestal 210. The magnetic confinement assembly 241 and magnetic confinement assembly 341 each include a plurality of permanent magnets 243, 343, or one or more inductive coils (not shown), that surround at least a portion of the target spacing adapter 240 and first zone 238, and target spacing adapter 340 and second zone 239, respectively. The plurality of permanent magnets 243, 343 within the magnetic confinement assembly 241 and magnetic confinement assembly 341 are each configured to create static or dynamic magnetic fields within at least the first zone 238 and second zone 239. The magnetic fields are configured to modify the shape of the plasma, concentration of plasma generated ions (e.g., gas and sputtered material) to control a density profile of the plasma and ionized sputtered atoms within the process volume 237. In one example, the magnetic confinement assembly 241 and magnetic confinement assembly 341 are configured to separately adjust the radial distribution of the generated plasma and ionized sputtered atoms over the surface of the workpiece. In one embodiment, the magnetic confinement assembly 241 and magnetic confinement assembly 341 each include a rotational magnetic holder 245 and 345 that are configured to rotate about a center axis of the process first zone 238 and second zone 239, respectively. In one or more embodiments, the rotational magnetic holder 245, including a motor for the rotational magnetic holder 245, is closer to the center axis 291 of the chamber 204 than illustrated for FIG. 2A.

In some embodiments, the plurality of permanent magnets 243, 343, or one or more inductive coils, are aligned and/or oriented relative to a plane that is parallel to the surface of the target 212, 312 (e.g., lower surface of target material 212M, 312M), such that the generated field(s) are properly aligned to allow for uniform deposition on a substrate. In this case, the central axes of each of the plurality of permanent magnets 243, 343, or one or more inductive coils, are aligned such that they positioned at an angle relative to a vertical direction (i.e., Z-direction).

A system controller 250, such as a programmable computer, is coupled to the PVD chamber 200 for controlling the PVD chamber 200 or components thereof. For example, the system controller 250 may control the operation of the PVD chamber 200 using direct control of the power source 206, the magnetron 208, the magnetron 308, the target spacing adapter 240, cooling of the target spacing adapter 240, the target spacing adapter 340, cooling of the target spacing adapter 340, the pedestal 210, cooling of the backing plate 218, the first actuator 220, the second actuator 222, the temperature control system 232, and/or the RF bias source 234, or using indirect control of other controllers associated therewith. In operation, the system controller 250 enables data acquisition and feedback from the respective components to coordinate processing in the PVD chamber 200.

The system controller 250 includes a programmable central processing unit (CPU) 252, which is operable with a memory 254 (e.g., non-volatile memory) and support circuits 256. The support circuits 256 (e.g., cache, clock circuits, input/output subsystems, power supplies, etc., and combinations thereof) are conventionally coupled to the CPU 252 and coupled to the various components of the PVD chamber 200.

In some embodiments, the CPU 252 is one of any form of general purpose computer processor used in an industrial setting, such as a programmable logic controller (PLC), for controlling various monitoring system component and sub-processors. The memory 254, coupled to the CPU 252, is non-transitory and is typically one or more of readily available memory such as random access memory (RAM), read only memory (ROM), floppy disk drive, hard disk, or any other form of digital storage, local or remote.

Herein, the memory 254 is in the form of a computer-readable storage media containing instructions (e.g., non-volatile memory), that when executed by the CPU 252, facilitates the operation of the PVD chamber 200. The instructions in the memory 254 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

In operation, the PVD chamber 200 is evacuated, back filled with argon gas and maintained at a vacuum pressure by a vacuum pump (not shown). The power source 206 applies a negative bias voltage to the target 212 to generate an electric field inside the chamber body 202. The electric field acts to attract gas ions, which due to their collision with the exposed surface of the target 212, generates electrons that enable a high-density plasma to be generated and sustained near the underside of the target 212, and ballistically causes the target material 212M to be ejected from the target's surface. The plasma is concentrated near the surface of target material 212M due to the magnetic field produced by the magnetron 208. The magnetic field forms a closed-loop annular path acting as an electron trap that reshapes the trajectories of the secondary electrons ejected from the target material 212M into a cycloidal path, greatly increasing the probability of ionization of the sputtering gas within the confinement zone. The plasma confined near the underside of the target 212 contains argon atoms, positively charged argon ions, free electrons, and neutral atoms (i.e., unionized atoms) sputtered from the target material 212M. The argon ions in the plasma strike the target surface and eject atoms of the target material, which are accelerated towards the workpiece 216 to deposit a thin film on the workpiece surface. As noted above, the magnetic confinement assembly 241, 341 is used to create static magnetic fields, dynamic magnetic fields, or both.

Similarly, the power source 307 also applies a negative bias voltage to the target 312 to generate an electric field inside the chamber body 202. The electric field acts to attract gas ions, which due to their collision with the exposed surface of the target 312, generates electrons that enable a high-density plasma to be generated and sustained near the underside of the target 312, and ballistically causes the target material 312M to be ejected from the target's surface. The plasma is concentrated near the surface of target material 312M due to the magnetic field produced by the magnetron 308. The magnetic field forms a closed-loop annular path acting as an electron trap that reshapes the trajectories of the secondary electrons ejected from the target material 312M into a cycloidal path, greatly increasing the probability of ionization of the sputtering gas within the confinement zone. The plasma confined near the underside of the target 312 contains argon atoms, positively charged argon ions, free electrons, and neutral atoms (i.e., unionized atoms) sputtered from the target material 312M. The argon ions in the plasma strike the target surface and eject atoms of the target material, which are accelerated towards the workpiece 216 to deposit a thin film on the workpiece surface. Similar to the magnetic confinement assembly 241, the magnetic confinement assembly 341 is used to create static magnetic fields, dynamic magnetic fields, or both.

In operation, the system controller 250 can control the magnetron 208, the magnetic confinement adapter 240, or both, according to a first sputtering profile to affect the properties of the plasma associated with target 212. And, the system controller 250 can control the magnetron 308, the magnetic confinement adapter 340, or both, according to a second sputtering profile to affect the properties of the plasma associated with target 312. Control of the plasma associated with the targets can allow the tuning of the uniformity and properties of the deposited film on the workpiece. The system control 250 can control the deposition angle, deposition rate, and profile for the distribution of sputtered material ejected from target 212 separate from the deposition angle, deposition rate, material, and profile for the distribution of sputtered material of material ejected from the target 312.

Inert gases, such as argon, are usually employed as the sputtering gas because they tend not to react with the target material or combine with any process gases and because they produce higher sputtering and deposition rates due to their relatively high molecular weight.

FIG. 2B is a top view illustrating an overlay of the targets 212 and 312 and the workpiece 216 in relation to the chamber body 202 of FIG. 2A, according to certain embodiments. In certain embodiments, the outer radial edge 212A, 312A of the target 212, and similarly target 312, extends a distance of about 1 inch to about 3 inches, such as about 1.5 inches beyond a corner of the workpiece 216. In certain embodiments, the inner radial edge 212C of the target 212 is spaced a distance of about 0.25 inches to about 0.75 inches, such as about 0.5 inches from the center axis 291, which may be coincident with a radial center of the chamber body 202. Similarly, the inner radial edge 312C of the target 312 is spaced a distance of about 0.25 inches to about 0.75 inches, such as about 0.5 inches from the center axis 291.

As shown in FIG. 2B, one or more of the target 212, target material 212M and backing plate 218 each have a triangular or delta shape that has three rounded corners, wherein one of the three rounded corners is positioned near or substantially adjacent to the center axis 291, and the magnetron 208 has a round shape. In one or more embodiments, for example as illustrated with reference FIG. 4 below, the magnetron has a triangular or delta shape similar to but smaller than the target 212 and backing plate 218. The target 212 and magnetron 208 are shaped and oriented such that the magnetron 208 is able to be translated over substantially the entire active area of the target 212, such as the target material 212M portion of the target 212. In some embodiments, the target 212 and magnetron 208 have substantially the same shape as described in more detail below. Similarly, as shown in FIG. 2B, one or more of the target 312, target material 312M and backing plate 318 each have a triangular or delta shape that has three rounded corners, wherein one of the three rounded corners is positioned near or substantially adjacent to the center axis 291, and the magnetron 308 has a round shape. In one or more embodiments, the magnetron 308 has a triangular or delta shape similar to the magnetron 408 illustrated with reference to FIG. 4. The target 312 and magnetron 308 are shaped and oriented such that the magnetron 308 is able to be translated over substantially the entire active area of the target 312, such as the target material 312M portion of the target 312. In some embodiments, the target 312 and magnetron 308 have substantially the same shape as described in more detail below.

Exemplary Sputtering Profile and Method of Use

Figure 3:
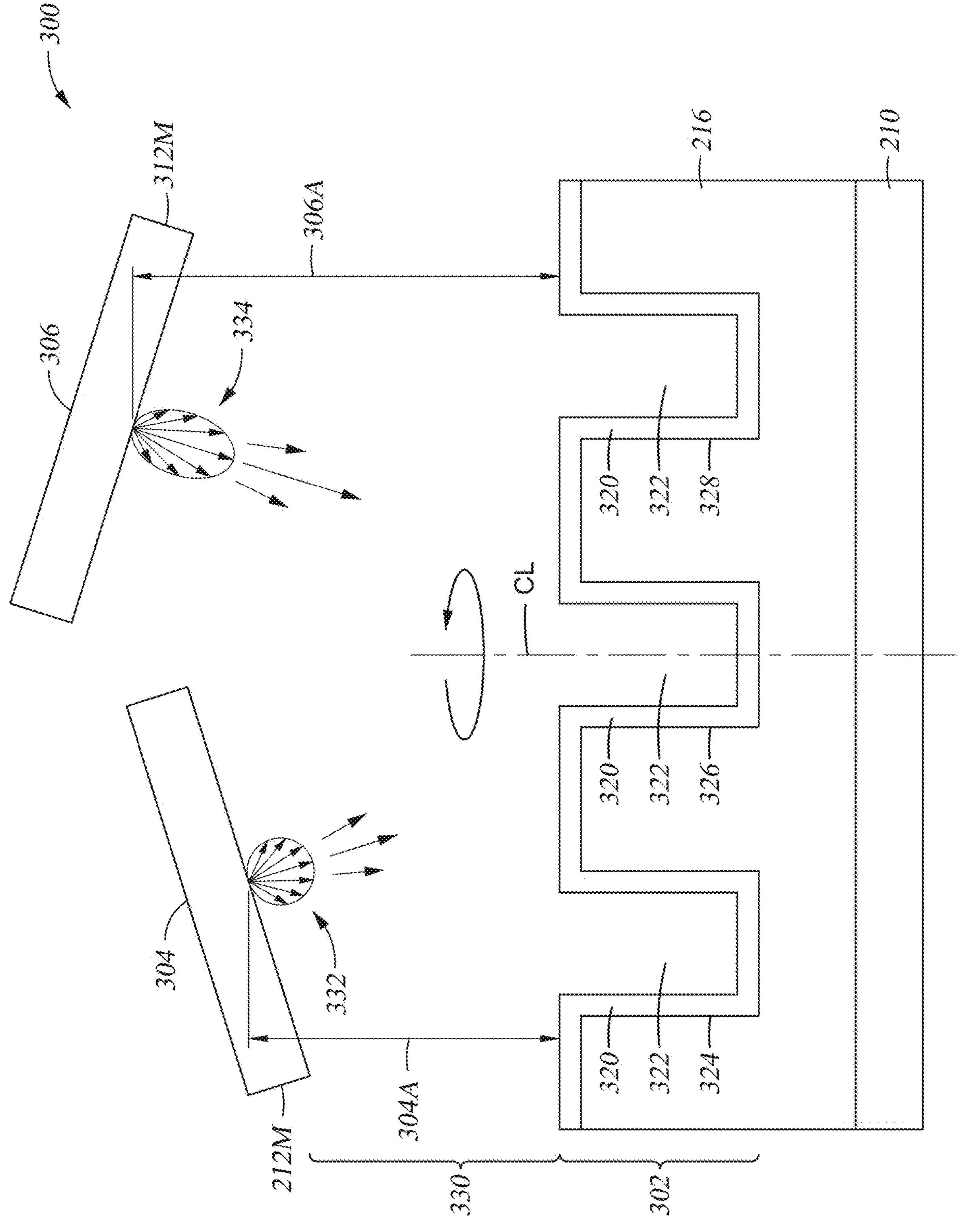
FIG. 3 is a cross-sectional view for sputter profiles for features of a workpiece that include high aspect ratio features, according to certain embodiments.

FIG. 3 illustrates a schematic cross-sectional view 300 of sputter profiles generated by a first cathode 304 and a second cathode 306 for features formed in a workpiece 216 that include high aspect ratio features. Cross-sectional view 300 includes representative features 302 of a workpiece, distribution of sputtered material 330, the first cathode 304 and the second cathode 306. In one or more embodiments, features 302 may be exemplary features of the workpiece 216 disposed on the upper surface 214 of the pedestal 210.

In one or more embodiments, first cathode 304 may be or include at least the target 212 and second cathode 306 may be or include at least the target 312. In one or more embodiments, the target material 212M of the first cathode 304 and the target material 312M of the second cathode 306 are composed of a same material. In some embodiments, the target material 212M may be composed of a different material than the target material 312M. In some embodiments, the target material is copper (Cu). In one or more embodiments the same material may be a pure material or alloy containing elements selected from the group of copper (Cu), molybdenum (Mo), nickel (Ni), titanium (Ti), tantalum (Ta), aluminum (Al), cobalt (Co), gold (Au), silver (Ag), manganese (Mn), and silicon (Si).

As further described herein, the first cathode 304 is disposed closer to (with less distance from) the upper surface 214 of the pedestal 210, and thus closer to the workpiece, than the second cathode 306, as shown by the distances 304A and 306A, which are measured from a center or centroid of the respective cathode.

In one or more embodiments, the features 302 are formed on a substrate, such as a glass substrate or semiconductor substrate. In some embodiments, the features 302 may be of another type of workpiece, for example an interposer (e.g., glass interposer or organic interposer). Features 302 include features closer to a first edge of the workpiece 216 (including feature 324), features closer to a center of the workpiece 216 (including feature 326), and features closer to a second edge of the workpiece 216 (including feature 328). A position of features 302 will change over time relative to the first cathode 304 and the second cathode 306 as workpiece 216 is rotated about a central axis (e.g., center line CL in FIG. 3. For example, at one instant in time (as illustrated in FIG. 3) some features are closer to an edge of the workpiece 216 that is closer to the first cathode 304 (including feature 324), some features are closer to a center of the workpiece 216 that are generally between the first cathode 304 and the second cathode 306 (including feature 326), and some features are closer to an edge of the workpiece 216 that is closer to the second cathode 306 (including feature 328). At another instant in time (not shown) the features (including feature 324) that were closer to the first cathode 304 at the first instant in time are now closer to the second cathode 306, the features that were closer to the center of the workpiece 216 are still near the center, and the features (including feature 328) that were closer to the second cathode 306 at the first instant in time are now closer to the first cathode 304.

In one or more embodiments, features 302 may be high aspect ratio features. High aspect ratio features include features whose depth exceeds the width, and in particular where the depth exceeds the width by at least a ratio of 2:1. In some embodiments, the depth exceeds the width by at least 5:1, and may be as high as 10:1. In one or more embodiments, the features 302 may have a ratio of depth to width that exceeds 10:1. In one or more embodiments high aspect ratio features include vias.

During operation of a PVD chamber that includes the first cathode 304 and the second cathode 306 (e.g., the PVD chamber 200), features 302 can be simultaneously exposed to two different distributions of sputtered materials 330 from the first cathode 304 and the second cathode 306. Feature 324 is simultaneously exposed to a distribution of sputtered material 332 from the first cathode 304 and a distribution of sputtered material 334 from the second cathode 306 to form the seed layer 320 of feature 324. Similarly, feature 326 is simultaneously exposed to the distribution of sputtered material 332 from the first cathode 304 and the distribution of sputtered material 334 from the second cathode 306 to form the seed layer 320 of feature 326, and feature 328 is simultaneously exposed to the distribution of sputtered material 332 from the first cathode 304 and the distribution of sputtered material 334 from the second cathode 306 to form the seed layer 320 of feature 326.

In some embodiments, the first cathode 304 and the second cathode 306 have different sputtering profiles. In one or more embodiments, the sputtering profile associated with the first cathode 304 and the second cathode 306 depends on the throw distance, the first deposition angle of the target relate to the workpiece, chamber pressure, magnetic field generated by the magnetrons positioned adjacent to the cathodes 304, 306, and the DC or RF power provided to each of the cathodes 304, 306. The sputtering profile can also be adjusted by the magnetic fields generated by the magnetic confinement assemblies. As such, the first cathode 304 may be associated with a first throw distance, a first deposition angle, and a first DC or RF power applied to the first cathode 304, and the second cathode 306 may be associated with a second throw distance, a second deposition angle, and a second DC or RF power applied to the second cathode 306. As discussed herein, the first cathode 304 is a different distance from the workpiece that includes features 302 than the second cathode 306, providing different throw distances (e.g., distances 304A and 306A). The first cathode 304 and the second cathode 306 can be tilted with different angles with reference to the workpiece (e.g., substrate, interposer, or other workpiece), and those can have different deposition angles. Moreover, one or more of the magnetron 208, the magnetic confinement adapter 240, or angle of the first cathode 304, may be controlled (e.g., by system controller 250) to control or otherwise affect the first sputtering profile; and one or more of the magnetron 308, the magnetic confinement adapter 340, or angle of the second cathode 306, may be controlled (e.g., by system controller 250) to control or otherwise affect the second sputtering profile. A first ion energy distribution may be controlled or otherwise affected (e.g., using system controller 250) by controlling one or more of the magnetron 208, the magnetic confinement adapter 240, or a bias of the power source 206. A second ion energy distribution may be controlled or otherwise affected (e.g., using system controller 250) by controlling one or more of the magnetron 308, the magnetic confinement adapter 340, or a bias of the power source 207.

The distribution of sputtered material 332 and the distribution of sputtered material 334 may impinge on feature 324 at different angles, due to a difference in throw distances, attributes of the magnetrons 208, 308, and with different ion or neutral energies of the sputtered materials due at least in part to the power applied to the cathodes 304 and 306. In one or more embodiments, the distribution of sputtered material 334 associated with the second cathode 306 may have (e.g., and be controlled to have) a relatively more narrow profile than the distribution of sputtered material 332 associated with the first cathode 304. The more narrow profile is associated with a relatively higher applied power, and provides a relatively greater amount of sputtered material deeper into feature 324. Conversely the distribution of sputtered material 332 is a relatively broader profile than the distribution of sputtered material 334, and is associated with a relatively lower applied power, and provides a relatively greater amount of sputtered material across the workpiece (e.g., has increased uniformity relative to the narrower profile associated with distribution of sputtered material 334) and relatively increased step coverage (e.g., relative to distribution of sputtered material 334).

Similarly, the distribution of sputtered material 332 and the distribution of sputtered material 334 may impinge on feature 326 at different angles, from different throw distances, and with different applied bias powers. And, the distribution of sputtered material 332 and the distribution of sputtered material 334 may impinge on feature 328 at different angles, from different throw distances, and with different ion energies.

In one or more embodiments, one or more of the magnetron 208 (a first magnetron) or the magnetron 308 (a second magnetron) may be simultaneously controlled (e.g., by system controller 250) during sputtering of the target material 212M from the target 212 and during sputtering of the target material 312M from the target 312, respectively. The magnetron 208 may be controlled according to a first scanning pattern and the magnetron 308 may be controlled according to a second scanning pattern. In one or more embodiments, the scanning pattern of magnetron 208 may include translation in the x-axis and y-axis directions over the target 212 during sputtering to provide to control erosion of the target 212, and the scanning pattern of magnetron 308 may include translation in the x-axis and y-axis directions over the target 312 during sputtering to provide to control erosion of the target 312. In one or more embodiments, the scanning pattern of magnetron 208 may include translation in the circumferential and radial directions over the target 212 during sputtering to provide to control erosion of the target 212, and the scanning pattern of magnetron 308 may include translation in the circumferential and radial directions over the target 312 during sputtering to provide to control erosion of the target 312.

Following operation of the PVD chamber to deposit the seed layer 320 of the features 302 of the workpiece, voids 322 may remain. Voids 322 may be later filled. In one or more embodiments, voids 322 may be filled with a same material as the seed layer 320, for example using an electroplating process.

Figure 4:
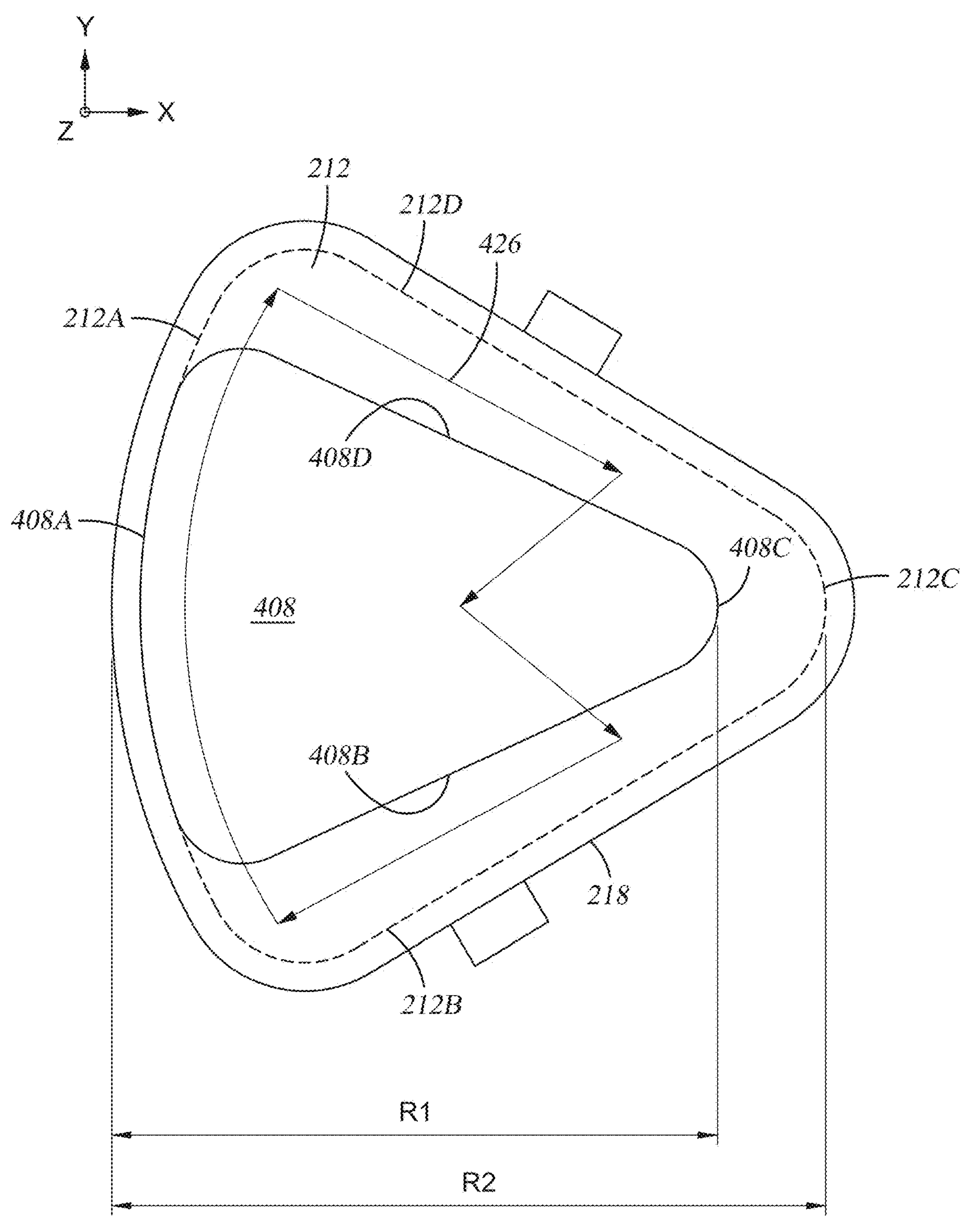
FIG. 4 is a top view illustrating an overlay of a magnetron and a target, according to certain embodiments.

As illustrated in FIG. 4, in one or more embodiments, a magnetron 408 has a triangular or delta shape that has three rounded corners, wherein one of the three rounded corners is positioned near or substantially adjacent to the center axis, in addition to the target 212, target material 212M and backing plate 218 that each have a triangular or delta shape that has three rounded corners. A radius R1 of the magnetron 408 is less than a corresponding radius R2 of the target 212 so that the magnetron 408 is able to translate in the x-axis and y-axis directions over the target 212, for example as described above. In one or more embodiments, the magnetron 408 may alternatively translate in a radial direction. As shown in FIG. 4, an outer radial edge 408A of the magnetron 408 has a radius of curvature that is less than or equal to the corresponding outer radial edge 212A of the target 212. In some embodiments, the radii of curvature differ by about 40% or less, such as about 20% or less. An arc length of the outer radial edge 408A of the magnetron 408 is less than a corresponding arc length of the outer radial edge 212A of the target 212. In one or more embodiments, the magnetron 408 is able to translate in the x-axis and y-axis directions over the target 212, for example as described above. In one or more embodiments, the magnetron 408 may alternatively translate in a circumferential direction. As shown in FIG. 4, respective opposite edges 408B and 408D of the magnetron 408 and corresponding opposite edges 212B and 212D of the target 212 are oriented close to parallel, respectively, to each other. In some embodiments, angles between the respective edges 408B, 212B and 408D, 212D are within a range of about 5° or less, such as about 0° to about 5°, such as about 0° (i.e., parallel to each other). Although not shown, a second magnetron that also has a triangular or delta shape that has three rounded corners may be similarly configured with reference to target 312.

As further discussed above, the magnetron 408 may be translated in the x-axis and y-axis directions over the target, or in radial and circumferential directions, to scan the magnetron 408 along a scan path over target 212. As shown in FIG. 4, a first actuator (not shown) and a second actuator (not shown) can be synchronized to scan the magnetron 408 along a scan path 426. Scan path 426 is provided for illustrative purposes only, and any number of different scan paths may scan the magnetron 408 over the active area of the target 212 consistent with the techniques described herein. Similarly, a first actuator (not shown) and second actuator (not shown) can be synchronized to scan a magnetron (not shown) along a scan path over the active area of the target 312 consistent with the techniques described herein.

Figure 5:
FIG. 5 is a diagram illustrating a method of processing a workpiece using a PVD chamber, according to certain embodiments.

FIG. 5 is a diagram illustrating a method 500 of processing a workpiece using a PVD chamber, according to certain embodiments. Note that PVD chamber 200 is described in the following example for illustrative purposes only.

At operation 502, a workpiece is disposed on an upper surface of a pedestal that is configured to support the workpiece thereon, and the workpiece is rotated. The pedestal is disposed within a processing region of the PVD chamber. In some embodiments, with reference to PVD chamber 200, the workpiece 216 is disposed on the upper surface 214 of the pedestal 210 that is configured to support the workpiece 216 thereon, and the workpiece 216 is rotated about a central axis (e.g., center line CL in FIG. 3). The pedestal 210 is disposed within a processing region 237 of the PVD chamber 200. In some embodiments, the pedestal 210 is rotated continuously in relation to the target 212 and target 312 to improve film deposition uniformity.

At operation 504, material is sputtered from a first target a first distance from a plane of the upper surface onto the workpiece during rotation in a first zone of the processing region and material is sputtered from a second target a second distance from the plane of the upper surface onto the workpiece during the rotation in a second zone of the processing region. In some embodiments, the first target is a same material as the second target. In one or more embodiments, with reference to PVD chamber 200, material is sputtered from the target 212 (a first target) a first distance from a plane of the upper surface 214 onto the workpiece 216 during rotation in the first zone 238 of the processing region 237 and material is sputtered from the target 312 (a second target) a second distance from the plane of the upper surface 214 onto the workpiece 216 during the rotation in the second zone 239 of the processing region 237, and the target 212 is a same material as the target 312. In some embodiments, the target 212 is a different material from the target 312, and are configured to deposit different materials.

At operation 506, a first voltage bias and a second voltage bias are simultaneously controlled, where the first voltage bias is for the first target during sputtering the material from the first target and the second voltage bias is for the second target during sputtering the material from the second target. In some embodiments, with reference to PVD chamber 200, the first voltage bias from the power source 206 and a second voltage bias from the power source 207 are simultaneously controlled by system controller 250. In one or more embodiments, the system controller causes the first voltage bias to be applied to the target 212, which causes material to be sputtered from the target 212, and causes the second voltage bias to be applied to the target 312, which causes material to be sputtered from the target 312. In one example, the first voltage bias applied to the target 212 is less than the second voltage bias applied to the target 312. In another example, the throw distance of the target 212 is smaller than the throw distance of the target 312. In another example, the magnetic field generated by the magnetic confinement assembly 241 associated with the target 212 is stronger than the magnetic field generated by the magnetic confinement assembly 341 associated with the target 312, or vice versa. In another example, the throw distance of the target 212 is smaller than the throw distance of the target 312, and the magnetic field generated by the magnetic confinement assembly 241 associated with the target 212 is less than the magnetic field generated by the magnetic confinement assembly 341 associated with the target 312. Also in one example, or in one of these examples, the angular distribution of the sputtered material from the target 212 is narrower than the angular distribution of the sputtered material from the target 312 due to at least one of the adjustment of the bias power applied to the target 212 being greater than the bias power applied to the target 312.

Additionally, in some embodiments of method 500, operations 502, 504, and 506 are substantially performed simultaneously. In some embodiments of method 500, operations 502 and 506 are initiated before operation 504 is initiated. In some embodiments of method 500, operations 502, 504, and 506 are initiated in a sequential order. In some embodiments of method 500, operations 502, 504, and 506 are initiated in a non-sequential order.

While the foregoing is directed to embodiments of the present disclosure, other and further embodiments of the disclosure may be devised without departing from the basic scope thereof, and the scope thereof is determined by the claims that follow.

What is claimed is:

1. A physical vapor deposition (PVD) chamber, comprising:
a pedestal disposed within a processing region of the PVD chamber, the pedestal having an upper surface that is configured to support a workpiece thereon; and
a lid assembly comprising a first target spacing adapter, and second target adapter, wherein:
the first target spacing adapter is configured to space a center of a first backing plate a first distance from a plane of the upper surface of the pedestal;
the second target spacing adapter is configured to space a center of a second backing plate a second distance from a plane of the upper surface of the pedestal, the second distance different from the first distance;
the first target spacing adapter is positioned above the pedestal, the first target spacing adapter comprising one or more first cooling channels and a first magnetic confinement assembly; and
the second target spacing adapter is positioned above the pedestal, the second target spacing adapter comprising one or more second cooling channels and a second magnetic confinement assembly.

2. The PVD chamber of claim 1, wherein:
the first target spacing adapter is tilted at a first angle in relation to the plane of the upper surface of the pedestal, and
the second target spacing adapter is tilted at a second angle in relation to the plane of the upper surface of the pedestal, the second angle different from the first angle.

3. The PVD chamber of claim 1, wherein:
the first target spacing adapter is tilted at a first angle in relation to the plane of the upper surface of the pedestal, and
the second target spacing adapter is tilted at a second angle in relation to the plane of the upper surface of the pedestal, the second angle opposing the first angle.

4. The PVD chamber of claim 1, wherein:
the first magnetic confinement assembly is configured about a first center axis of the first target spacing adapter, the first center axis passing through the upper surface of the pedestal, and
the second magnetic confinement assembly is configured about a second center axis of the second target spacing adapter, the second center axis passing through the upper surface of the pedestal.

5. The PVD chamber of claim 4, further comprising a system controller configured to control a first field generated by the first magnetic confinement assembly according to a first sputtering profile and a second field generated by the second magnetic confinement assembly according to a second sputtering profile.

6. The PVD chamber of claim 4, wherein:
the first one or more channels are fluidly coupled with a first heat exchanger to control a first temperature profile of the first magnetic confinement assembly, and
the second one or more channels are fluidly coupled with the first heat exchanger or a second heat exchanger to control a second temperature profile of the second magnetic confinement assembly.

7. The PVD chamber of claim 1, wherein the first target spacing adapter and the second target spacing adapter are directed to different areas of upper surface of the pedestal.

8. The PVD chamber of claim 1, wherein the upper surface of the pedestal is configured to receive a square or rectangular workpiece having sides that have a length of about 500 mm or greater.

9. A physical vapor deposition (PVD) chamber, comprising:
a pedestal disposed within a processing region of the PVD chamber, the pedestal having an upper surface that is configured to support a workpiece thereon;
a lid assembly comprising a first target spacing adapter, and a second spacing adapter, wherein:
the first target spacing adapter is configured to space a center of a first backing plate a first distance from a plane of the upper surface of the pedestal;
the second target spacing adapter is configured to space a center of a second backing plate a second distance from a plane of the upper surface of the pedestal, the second distance different from the first distance;
the first target spacing adapter is positioned above the pedestal, the first target spacing adapter comprising one or more first cooling channels and a first magnetic confinement assembly;
the second target spacing adapter is positioned above the pedestal, the second target spacing adapter comprising one or more second cooling channels and a second magnetic confinement assembly; and
a computer readable medium storing instructions that when executed by a processor of a system that includes the PVD chamber, cause the system to control a first field generated by the first magnetic confinement assembly according to a first sputtering profile and a second field generated by the second magnetic confinement assembly according to a second sputtering profile.

10. The PVD chamber of claim 9, wherein:
the first magnetic confinement assembly is configured about a first center axis of the first target spacing adapter, the first center axis passing through the upper surface of the pedestal, and
the second magnetic confinement assembly is configured about a second center axis of the second target spacing adapter, the second center axis passing through the upper surface of the pedestal.

11. The PVD chamber of claim 10, further comprising:
a first magnetron disposed over a portion of the first target spacing adapter, and in a region of the lid assembly that is maintained at atmospheric pressure; and
a second magnetron disposed over a portion of the second target spacing adapter, and in the region of the lid assembly that is maintained at atmospheric pressure.

12. A method for performing physical vapor deposition (PVD), comprising:
disposing a workpiece on an upper surface of a pedestal that is configured to support the workpiece thereon, the pedestal disposed within a processing region of a PVD chamber;
sputtering material from a first target onto the workpiece in a first zone of the processing region and material from a second target onto the workpiece in a second zone of the processing region, wherein a first target spacing adapter provides a center of a first surface of the first target a first distance from a plane of the upper surface, and wherein a second target spacing adapter provides a center of a second surface of the second target a second distance from a plane of the upper surface, wherein:

the second distance different from the first distance;

the first target spacing adapter is positioned between the first target and the pedestal, the first target spacing adapter comprising a first one or more cooling channels and a first magnetic confinement assembly; and the second target spacing adapter is positioned between the second target and the pedestal, the second target spacing adapter comprising a second one or more cooling channels and a second magnetic confinement assembly; and controlling a first voltage bias for the first target during sputtering the material from the first target and a second voltage bias for the second target during sputtering the material from the second target.

13. The method of claim 12, further comprising:

simultaneously controlling a first magnetron according to a first scanning pattern for the first target during sputtering the material from the first target and a second magnetron according to a second scanning pattern for the second target during sputtering the material from the second target.

14. The method of claim 12, further comprising:

controlling a first field generated by the first magnetic confinement assembly configured about the first zone of processing region according to a first sputtering profile; and controlling a second field generated by the second magnetic confinement assembly configured about the second zone of processing region according to a second sputtering profile.

15. The method of claim 14, further comprising:

directing a fluid to the first one or more channels fluidly coupled with a first heat exchanger to control a first temperature profile of the first magnetic housing; and directing a fluid to the second one or more channels fluidly coupled with the first heat exchanger or a second heat exchanger to control a second temperature profile of the second magnetic housing.

* * * * *